United States Patent
Polo et al.

(10) Patent No.: US 10,466,601 B2
(45) Date of Patent: Nov. 5, 2019

(54) ALIGNMENT SENSOR FOR LITHOGRAPHIC APPARATUS

(71) Applicants: ASML Netherlands B.V., Veldhoven (NL); ASML Holding N.V., Veldhoven (NL)

(72) Inventors: Alessandro Polo, Arendonk (BE); Simon Gijsbert Josephus Mathijssen, Rosmalen (NL); Patricius Aloysius Jacobus Tinnemans, Hapert (NL); Scott Douglas Coston, New Milford, CT (US); Ronan James Havelin, Norwalk, CT (US)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 0 days.

(21) Appl. No.: 15/756,057

(22) PCT Filed: Aug. 23, 2016

(86) PCT No.: PCT/EP2016/069876
§ 371 (c)(1),
(2) Date: Feb. 27, 2018

(87) PCT Pub. No.: WO2017/045874
PCT Pub. Date: Mar. 23, 2017

(65) Prior Publication Data
US 2018/0329316 A1    Nov. 15, 2018

Related U.S. Application Data (60) Provisional application No. 62/220,666, filed on Sep. 18, 2015.

(51) Int. Cl.
*G03F 7/20* (2006.01)
*G03F 9/00* (2006.01)
(Continued)

(52) U.S. Cl.
CPC ......... *G03F 9/7065* (2013.01); *G02B 6/2938* (2013.01); *G02B 27/1006* (2013.01);
(Continued)

(58) Field of Classification Search
CPC .............. G02B 6/2938; G02B 27/1006; G02B 27/141; G03F 7/70616; G03F 7/7085; G03F 9/7065
(Continued)

(56) References Cited

U.S. PATENT DOCUMENTS

| 6,400,861 B1 | 6/2002 | Forbes et al. |
| 7,139,447 B1 | 11/2006 | Basu |

(Continued)

FOREIGN PATENT DOCUMENTS

| CN | 1949087 | 4/2007 |
| CN | 103930749 | 7/2014 |

(Continued)

OTHER PUBLICATIONS

International Search Report and Written Opinion dated Nov. 24, 2016 in corresponding International Patent Application No. PCT/EP2016/069876.
(Continued)

*Primary Examiner* — Colin W Kreutzer
(74) *Attorney, Agent, or Firm* — Pillsbury Winthrop Shaw Pittman LLP (57) ABSTRACT

A lithographic apparatus includes an alignment sensor configured to determine the position of an alignment target having a periodic structure. The alignment sensor includes a demultiplexer to demultiplex a number of intensity channels. The demultiplexer includes a number of stages arranged in series and a number of demultiplexing components, each demultiplexing component operable to divide an input radiation beam into two radiation beam portions. The
(Continued)

first stage has a first demultiplexing component that is arranged to receive as an input radiation beam an incident radiation beam. Each successive stage is arranged such that it has twice the number of demultiplexing components as a preceding stage, each demultiplexing component of each stage after the first stage receiving as an input one of the radiation beam portions output from a demultiplexing component of the preceding stage.

20 Claims, 6 Drawing Sheets (51) Int. Cl.
G02B 6/293 (2006.01)
G02B 27/10 (2006.01)
G02B 27/14 (2006.01)
(52) U.S. Cl.
CPC ......... *G02B 27/141* (2013.01); *G03F 7/7085* (2013.01); *G03F 7/70616* (2013.01)
(58) Field of Classification Search
USPC .................. 355/53, 67, 71; 356/399–401
See application file for complete search history.

(56) References Cited

U.S. PATENT DOCUMENTS

| 2002/0154857 | A1  | 10/2002 | Goodman et al. |
| 2010/0195102 | A1* | 8/2010  | Den Boef ............. B29C 43/021 356/401 |
| 2015/0261098 | A1  | 9/2015  | Zhang et al. |

FOREIGN PATENT DOCUMENTS

| EP | 0074152    | 3/1983  |
| EP | 1372040    | 12/2003 |
| JP | 58054313   | 3/1983  |
| JP | 64086518   | 3/1989  |
| JP | 08213300   | 8/1996  |
| JP | 09229628   | 9/1997  |
| JP | 2014531023 | 11/2014 |
| WO | 2008/052405 | 5/2008 |

OTHER PUBLICATIONS

Taiwan Office Action dated Jun. 12, 2017 in corresponding Taiwan Patent Application No. 105128753.
Japanese Office Action issued in corresponding Japanese Patent Application No. 2018-514795, dated May 14, 2019.
Chinese Office Action issued in corresponding Chinese Patent Application No. 201680054143.8, dated Jul. 31, 2019.

* cited by examiner

ALIGNMENT SENSOR FOR LITHOGRAPHIC APPARATUS

CROSS-REFERENCE TO RELATED APPLICATIONS

This application is the U.S. national phase entry of PCT patent application no. PCT/EP2016/069876, which was filed on Aug. 23, 2016, which claims the benefit of priority of U.S. provisional application No. 62/220,666, which was filed on Sep. 18 2015, and each of which is incorporated herein in its entirety by reference.

FIELD

The present description relates to an alignment sensor for a lithographic apparatus. In particular the present description relates to a demultiplexer for an alignment sensor and a method of demultiplexing.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to place device features accurately on the substrate, one or more alignment marks are generally provided on, for example, the substrate, and the lithographic apparatus includes one or more alignment sensors by which the position of the mark may be measured accurately. The alignment sensor may be effectively a position measuring apparatus. Different types of marks and different types of alignment sensors are known from different times and different manufacturers.

SUMMARY

Alignment sensors may use one or several radiation sources to generate a plurality of radiation beams with different wavelengths. In this fashion, a sensor may measure position using several wavelengths (e.g., colors) and/or polarizations of radiation (e.g., light) on the same target grating or gratings. No single color or polarization may be ideal for measuring in all situations, so the system selects from a number of signals, which one provides the most reliable position information.

As substrates become increasingly complex, with increasing numbers of patterns being applied to them, adding additional wavelengths and/or polarizations may increase the ability of the alignment sensor to provide reliable position information. However, this increases the complexity of the alignment system since additional optical components may be needed. In particular, given that each wavelength is typically multiplexed into one or more beams, adding additional wavelengths can increase the complexity of both a multiplexer and a demultiplexer used to respectively combine and separate individual wavelengths. Additionally, the increased number of optical components should be optically matched within strict tolerances to avoid reducing the performance of the alignment sensor. Furthermore, adding additional optical components can increase the space required by the alignment sensor. However, an alignment sensor should fit within the physical constraints of the lithographic apparatus in order for both the sensor and the apparatus to function properly.

It is desirable, for example, to increase the number of different wavelengths that can be used by an alignment sensor without increasing the space required by the alignment sensor. It is desirable, for example, to increase the number of wavelengths without increasing the complexity of the alignment sensor, in particular the number of optical components used.

According to an aspect, there is provided an apparatus for demultiplexing an incident radiation beam comprising a first wavelength band, the apparatus comprising:

a plurality of stages arranged in series, the plurality of stages comprising a first stage and one or more subsequent stages; and a plurality of demultiplexing components, each demultiplexing component being operable to divide an input radiation beam into two radiation beam portions, wherein:

the first stage comprises a first demultiplexing component arranged to receive as an input radiation beam the incident radiation beam, and the plurality of demultiplexing components are arranged such that each successive stage comprises twice the number of demultiplexing components as a preceding stage, each demultiplexing component of each stage after the first stage receiving as an input one of the radiation beam portions output from a demultiplexing component of the preceding stage.

Each of the demultiplexing components may comprise a dichroic filter.

In an embodiment, the first wavelength band comprises a plurality of optical channels, each optical channel having a unique central wavelength, and the central wavelength of each of the radiation beam portions from the last stage corresponds to the central wavelength of one of the channels of the plurality of channels.

In another embodiment, the first wavelength band comprises $2^k$ channels, and the apparatus comprises k stages, the apparatus arranged such that each radiation beam portion from the last stage comprises a single channel.

The apparatus may comprise a plurality of optical outputs, wherein each optical output is operable to output a specific radiation beam portion from the last stage of the apparatus.

According to a further aspect, there is provided an alignment sensor according to the apparatus as set forth herein.

According to a further aspect, there is provided a lithographic apparatus comprising an alignment sensor as set forth herein.

According to a further aspect, there is provided a method of demultiplexing an incident radiation beam comprising a first wavelength band, the method comprising:

receiving, at a first stage comprising a first demultiplexing component, as an input radiation beam the incident radiation beam;

using the first demultiplexing component to divide the input radiation beam into two radiation beam portions;

receiving, at one or more successive stages, as an input radiation beam radiation beam portions from a preceding stage, each of the one or more successive stages being arranged such that each successive stage comprises twice the number of demultiplexing components as a preceding stage; and using each of the demultiplexing components to divide each radiation beam portion output by the preceding stage into two further radiation beam portions.

In an embodiment, wherein the first wavelength band comprises a plurality of optical channels, the method may further comprise using each demultiplexing component in the last stage to divide the input radiation beams into a plurality of output radiation beam portions, wherein the central wavelength of each of the output radiation beam portions corresponds to the central wavelength of one of the channels of the plurality of optical channels.

The first wavelength band may comprise $2^k$ channels, the method may comprise k stages, and each of the output radiation beam portions may comprise a single channel.

In an embodiment, the method may comprise outputting a specific radiation beam portion from the last stage to a specific optical output.

According to a further aspect, there is provided an apparatus to carry out a method as set forth herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Before describing embodiments of the invention in detail, it is instructive to present an example environment in which embodiments of the present invention may be implemented.

Figure 1:
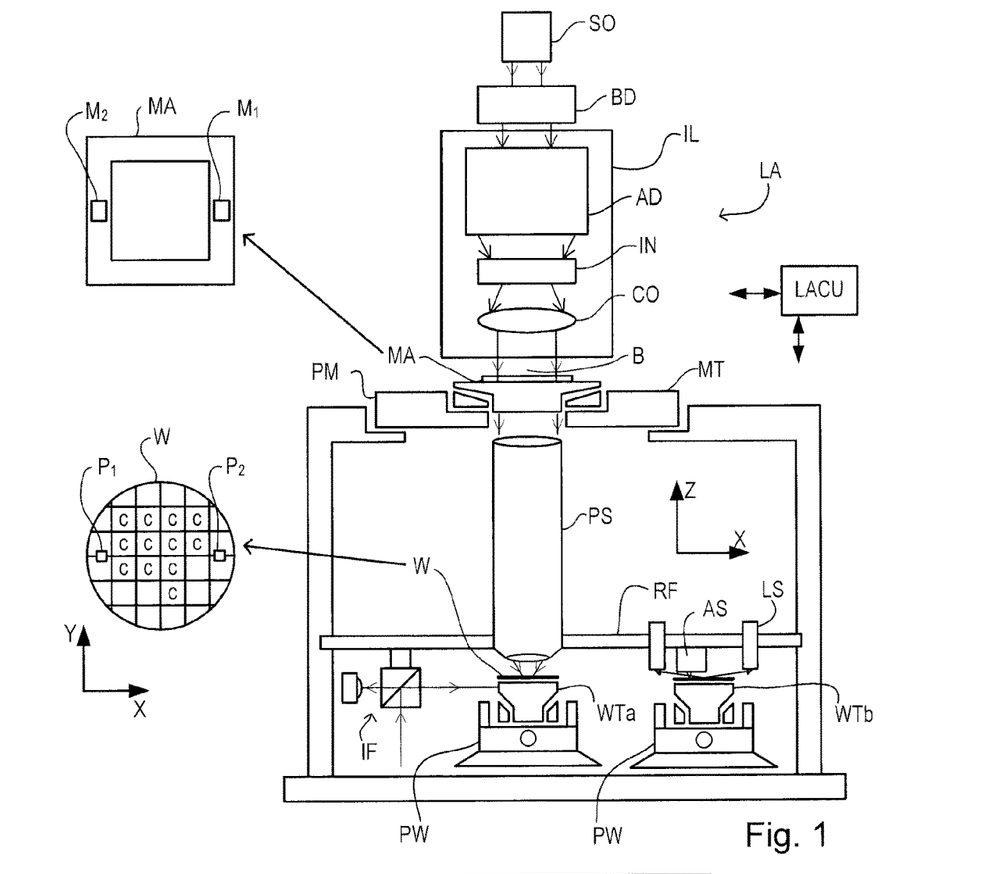
FIG. 1 depicts an exemplary lithographic apparatus including an alignment sensor as a measuring apparatus.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment mark may also be included within dies, in amongst the device features, in which case it is desirable that the markers be as small as possible and not require any different imaging or process conditions than adjacent features. The alignment system, which detects the alignment markers is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned. Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
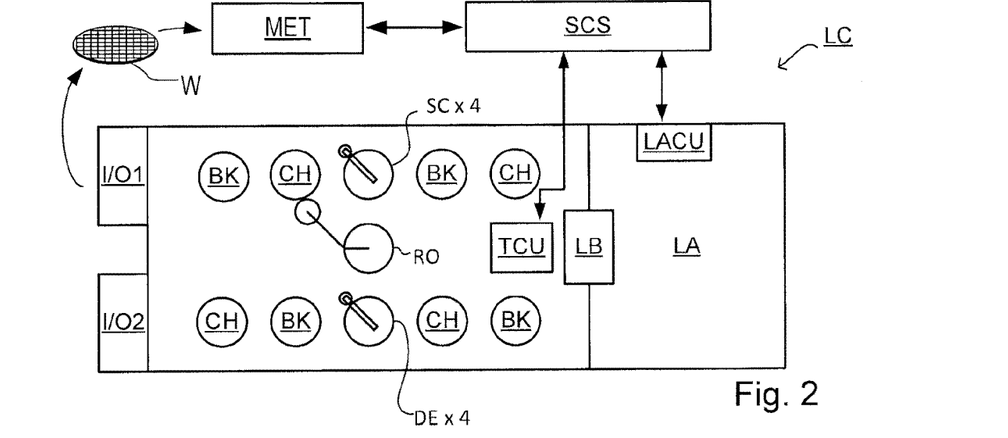
FIG. 2 depicts a lithographic cell or cluster in which the apparatus of FIG. 1 may be used.

As shown in FIG. 2, the lithographic apparatus LA may form part of a lithographic cell LC, also sometimes referred to as a lithocell or cluster, which also includes apparatuses to perform pre- and post-exposure processes on a substrate. Conventionally these include one or more spin coaters SC to deposit one or more resist layers, one or more developers DE to develop exposed resist, one or more chill plates CH and/or one or more bake plates BK. A substrate handler, or robot, RO picks up one or more substrates from input/output port I/O1, I/O2, moves them between the different process apparatuses and delivers them to the loading bay LB of the lithographic apparatus. These apparatuses, which are often collectively referred to as the track, are under the control of a track control unit TCU which is itself controlled by the supervisory control system SCS, which also controls the lithographic apparatus via lithography control unit LACU. Thus, the different apparatuses can be operated to maximize throughput and processing efficiency. The substrates processed by the track are then transferred to one or more other processing tools for etching and/or other chemical or physical treatments within the device manufacturing process.

The lithographic apparatus control unit LACU controls the movements and measurements of various actuators and sensors described. The control unit LACU also includes signal processing and data processing capacity to implement desired calculations relevant to the operation of the apparatus. In the terminology of the introduction and claims, the combination of these processing and control functions is referred to simply as the "controller". In practice, the control unit LACU will be realized as a system of many sub-units, each handling real-time data acquisition, processing and control of a subsystem or component within the apparatus. For example, one processing subsystem may be dedicated to servo control of the substrate positioner PW. Separate units may handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 3:
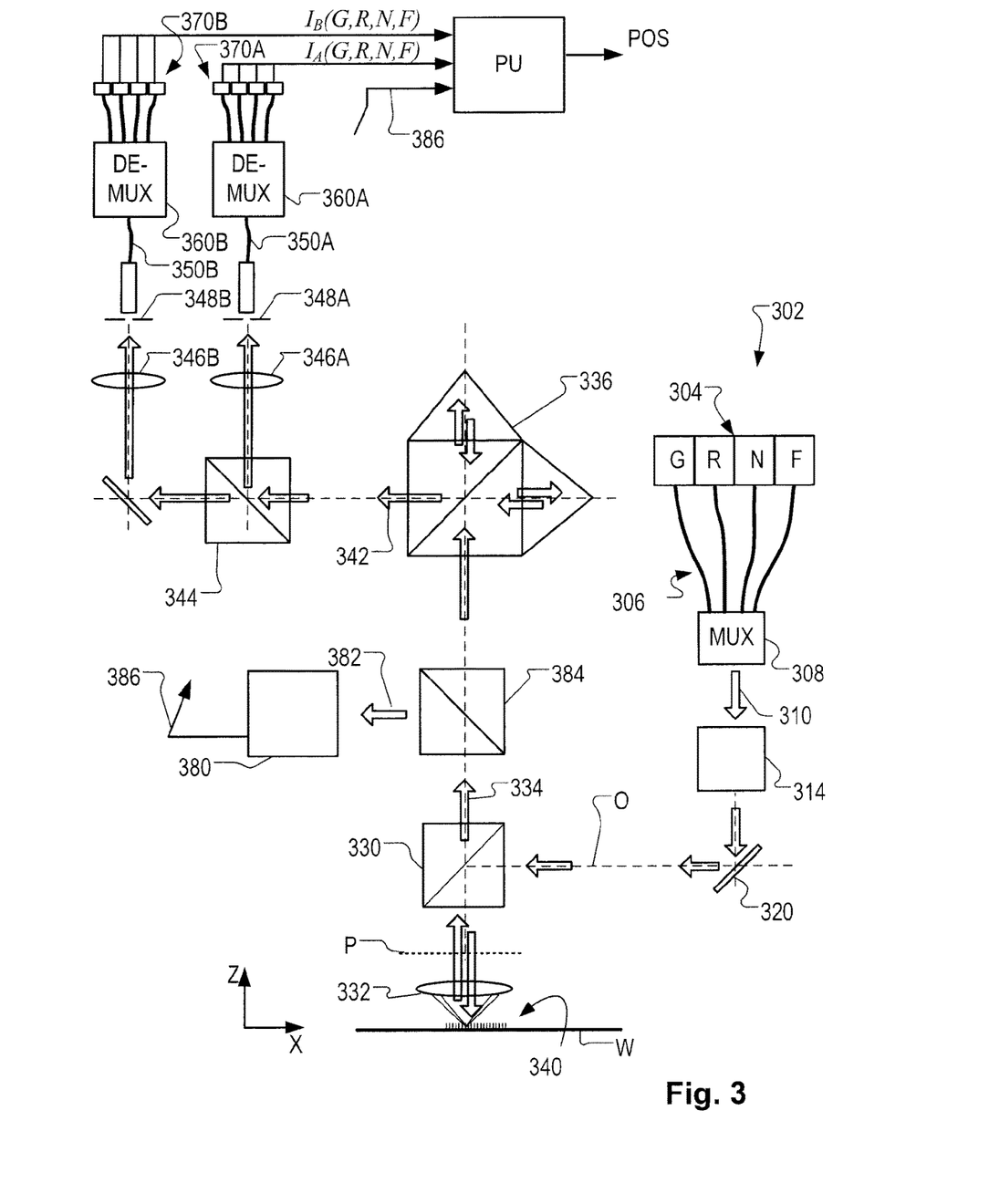
FIG. 3 is a schematic diagram of an alignment sensor suitable for use in the apparatus of FIG. 1.

FIG. 3 is a schematic block diagram of an alignment sensor AS. In illumination subsystem 302, source 304 comprises four individual sources to provide radiation with four wavelengths named green (labeled G), red (R), near infrared (N) and far infrared (F). For convenience in the following discussion, the radiation at these four different wavelengths will be called four colors of radiation, it being immaterial for present purposes whether they are in the visible or non-visible parts of the electromagnetic spectrum. All the sources are linearly polarized, with the G and N radiation being oriented the same direction as one another, and the R and F radiation being polarized orthogonally to the G and N polarization.

The four colors are transported by polarization maintaining fibers 306 to a multiplexer 308, where they are combined into a single combined beam 310 that comprises all four colors.

The combined beam 310 is delivered to an illumination profiling optic 314. The combined beam then goes via suitable delivery optic 320 into optical element 330 (e.g., beam splitter). The beam is then re-directed from, e.g., a partially- or fully reflecting surface (e.g. a 0.5 mm diameter spot mirror), which is inside the optical element 330. The objective lens 332 focuses the beam to a narrow beam which is reflected and/or diffracted by the periodic structure (e.g. grating) formed by alignment mark 340 on, e.g., the substrate W. Radiation is collected by the objective 332, with for example numerical aperture NA=0.6. This NA value may allow at least ten orders of diffraction to be collected from a grating with 16 µm pitch, for each of the colors.

The reflected/diffracted radiation forming information carrying beam 334 is then transported to the self-referencing interferometer 336. Interferometer 336 splits the information carrying beam into two parts with orthogonal polarization, rotates these parts about the optical axis by 180° relative to one another, and combines them into an outgoing radiation beam 342. The outgoing radiation beam exits the interferometer, after which a beam splitter 344 splits the optical signal into two paths designated A and B. One path contains the sum of the two rotated fields, and the other contains the difference. Depending on the initial polarization direction, the sum ends up in path A or path B. So in this example the sum signals for G and N end up in one path, and R and F in the other path. For each color, the corresponding difference signal ends up in the other path.

In this arrangement one polarization for illumination in each color is used. Measurements with two polarizations per color could be made, by changing the polarization between readings (or by time division multiplexing within a reading). However, to maintain high throughput while benefiting from some diversity in color and polarization, a set of different colors with single, but different, polarizations represents a good compromise between diversity and measurement throughput. To increase diversity without impacting throughput, one can envisage an implementation similar to the four-color scheme presented here, but using more colors, for example eight or sixteen, with mixed polarizations.

The radiation for each path A and B is collected by a respective collector lens assembly 346A and 346B. The radiation then goes through an aperture 348A or 348B that eliminates most of the radiation from outside the spot on the substrate. Multimode fiber 350A and 350B transports the collected radiation of each path to a respective demultiplexer 360A and 360B. In some embodiments, the multimode fibers may be used to eliminate radiation from outside the spot on the substrate, thereby obviating the need for apertures 348A and 348B. The demultiplexer splits each path in the original four colors, so that a total of eight optical signals are delivered to detectors 370A and 370B. In one practical embodiment, fiber goes from the demultiplexer to eight detector elements on a detector circuit board. The detectors provide no spatial resolution, but deliver time-varying intensity signals $I_A$ and $I_B$ for each color, as the apparatus scans the mark 340. The signals are actually position-dependent signals, but received as time-varying signals (waveforms) synchronized with the physical scanning movement between the apparatus and the mark.

Processing unit PU receives the intensity waveforms from the eight detectors and processes them to provide a position measurement POS. Because there are eight signals to choose from, based on different wavelengths and incident polarizations, the apparatus can obtain useable measurements in a wide variety of situations. In this regard it should be remembered that the mark 340 may be buried under a number of layers of different materials and structures. Some wavelengths will penetrate different materials and structures better than others. Processing unit PU conventionally processes the waveforms and provides a position measurement based on the one which is providing the strongest position signal. The remaining waveforms may be disregarded. In a simple implementation, the 'recipe' for each measurement task may specify which signal to use, based on advance knowledge of the target structure, and experimental investigations.

Included in the present example is an asymmetry measuring arrangement 380. One cause of error in alignment may be asymmetry in the features making up a mark, e.g. variations in sidewall angle or variations in bottom surface angle of the features, which may be caused by, e.g., processing applied to one or more subsequent product layers. By measuring the asymmetry, it is possible to correct for the influence of mark asymmetry on the position information provided by the alignment sensor. Asymmetry measuring arrangement 380 receives a part 382 of the information carrying beam 334 through a beam splitter 384 positioned in advance of the interferometer 336. Signal 386 conveying asymmetry measurement information is passed from arrangement 380 to the processing unit PU. The processing unit need not be integral to the alignment sensor, and may instead be connected to the alignment sensor in a suitable way.

It is to be noted that the alignment sensor may comprise additional optical components and elements to those described above. For example, the alignment sensor may comprise one or several beam-shaping components, such as polarizers, quarter-waveplates or half-waveplates.

Figure 4:
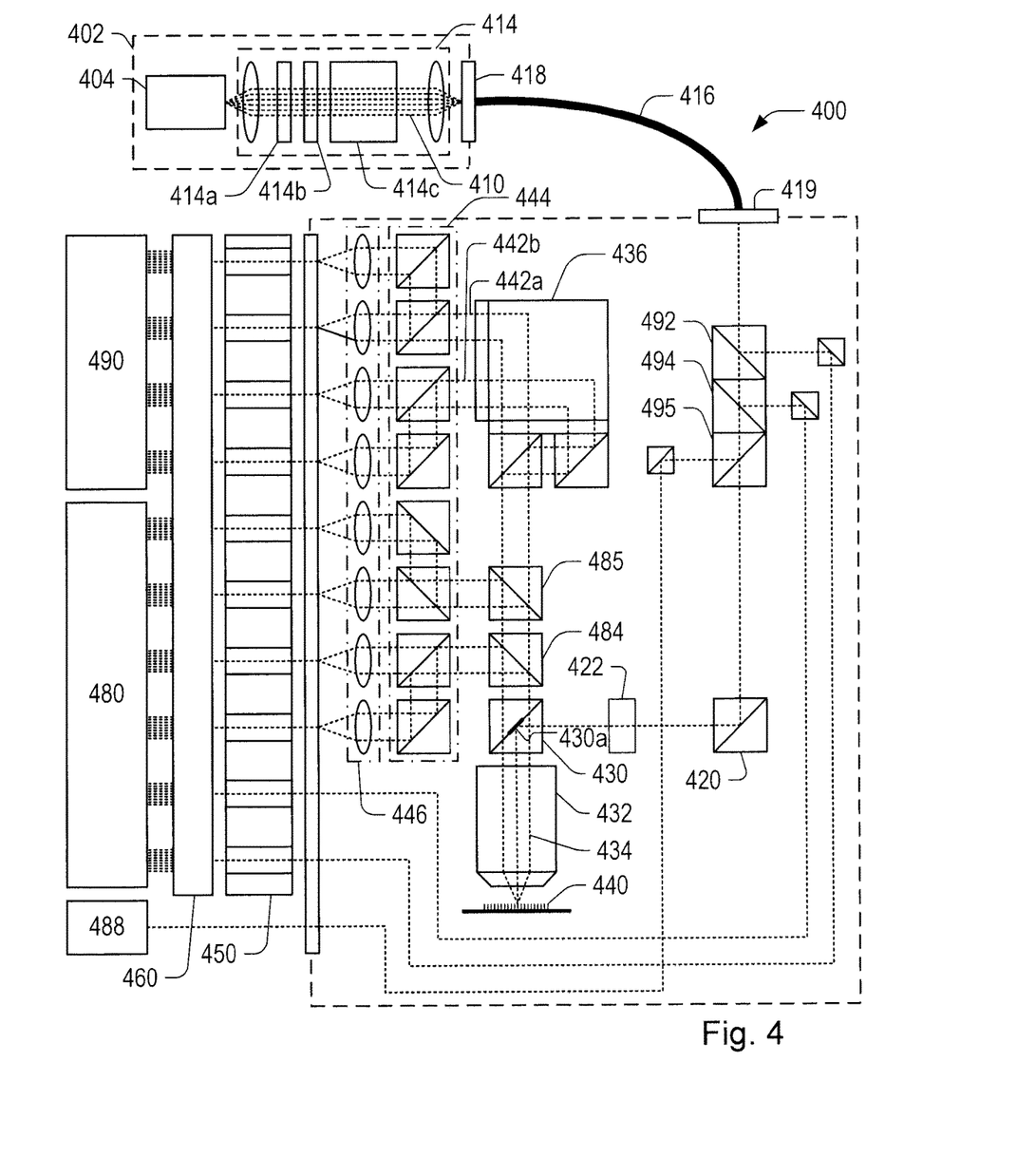
FIG. 4 is a schematic diagram of an alignment sensor suitable for use in the apparatus of FIG. 1.

Referring to FIG. 4, a further exemplary alignment sensor 400 will now be described. For ease of comparison with FIG. 3, parts of the alignment sensor are labelled with reference signs similar to those used in FIG. 3, but with prefix '4' instead of '3'. It will of course be appreciated that the various elements described in the following are exemplary, and that alternative arrangements may be envisaged.

Connected to the alignment sensor is an illumination subsystem 402 that comprises a radiation source 404. The radiation source 404 has a particular output wavelength band. The exact properties of the output wavelength band are dependent on the type and characteristics of the radiation source. In the present example, the radiation source 404 is a supercontinuum source that has an output wavelength band that is wide enough that it can be subdivided into a plurality of optical channels, each optical channel having a specific central wavelength. Each optical channel is functionally analogous to the "colors" of the radiation described in the alignment sensor described above with reference to FIG. 3. It should be noted that the type of radiation source is, in principle, irrelevant provided it is spatially coherent and that the output wavelength band has a sufficiently wide output spectrum to subdivide it into a suitable number of discrete optical channels.

The radiation source outputs a beam that propagates through an illumination profiling optic 414, which may comprise one or several optical profiling elements. In the present example, the profiling optic comprises an optical filter 414a, a polarizer 414b, and a color filter 414c. The optical filter 414a is a band pass filter that transmits radiation with wavelengths of, e.g., 500-900 nm. The optical filter allows unwanted parts of the radiation source spectrum, which may otherwise impact the operation of the alignment sensor, to be removed. The polarizer 414b enables control over the polarization of the radiation in the system. The color filter 414c allows the output spectrum of the illumination subsystem to be precisely controlled. The optical profiling elements described here are only an exemplary combination of optical profiling elements. Some or all of the optical profiling elements described here may be omitted or may be used in combination with other optical profiling elements. The types and optical properties of any optical profiling elements used in the illumination profiling optic 414 will depend on the optical properties of the radiation source 404 as well as the desired optical characteristics of a radiation beam 410 that is output by the illumination subsystem.

The radiation beam 410 is transferred to an input fiber 416 through output 418. The output may comprise a simple connector plate, against which the input fiber abuts. The input fiber connects to an input 419 of the alignment sensor. In one example, the input comprises a connector plate that abuts the input fiber.

The radiation beam passes through a plurality of beamsplitters 492, 494, 495. Each beamsplitter is operable to split off a fraction of the radiation beam. In one example, the beamsplitters each split off 5% of the radiation beam. In other examples, the fraction may be 1%, 2%, 3%, or 10%. In principle, any desired fraction of the radiation beam could be split off by the beamsplitters. The function of the fraction of the radiation beam split off by the beamsplitters 492, 494 will be described below. The fraction of the radiation beam split off by beamsplitter 495 propagates to an intensity normalization detection element 488. It should, of course, be appreciated that the arrangement of beamsplitters 492, 494, 495 is exemplary only, and that other arrangements are possible.

The alignment sensor optionally comprises one or several further optical components 422 through which the radiation beam propagates In one example, the further optical components comprise a quarter wave plate or a half wave plate.

The radiation beam then propagates, via, e.g., optical component 420, into optical component 430 (e.g. a beam splitter). Similarly to the optical component described with reference to FIG. 3, the radiation beam then is redirected by, e.g., a partially- or fully reflecting surface 430a, which is inside the optical component 430.

The beam passes through objective lens 432, and is reflected/diffracted by alignment mark 440. The information carrying beam 434, which is formed by the radiation reflected/diffracted by the alignment mark, passes back through the objective lens 432 and the optical component 430.

The information carrying beam 434 then passes through beamsplitters 484, 485. Each beamsplitter splits off a fraction of the information carrying beam. In the present example, each beamsplitter splits off 10% of the intensity of the information carrying beam, although in principle any suitable percentage could be split off (such as 1%, 2%, 5%, 7% or 20%). The radiation beams split off from the information carrying beam then propagate through an arrangement of beamsplitters 444 and an arrangement of optical components 446.

The information carrying beam 434 propagates through self-referencing interferometer 436. The interferometer splits the information carrying beam into two outgoing beams: a first outgoing beam 442a that contains the sum of the rotated fields; and a second outgoing beam 442b that contains the difference between the rotated fields. It is to be noted that, although a single interferometer is shown in this example, it is possible to use several interferometers to split the information carrying beam. In another example, two interferometers are used, wherein each interferometer has a unique polarization state of radiation reflected/diffracted by the alignment mark. The first outgoing beam and second outgoing beams propagate through the arrangement of beamsplitters 444 and arrangement of optical components 446.

The arrangement of beamsplitters 444 is arranged so that each of the input beams is split into a horizontal component and a vertical component. Each of the horizontal and vertical components is then guided to a separate optical component of the arrangement of optical components 446. In the present example, each component is a single focusing lens, although this is exemplary only.

The radiation beams output by the arrangement of optical components are coupled into a delivery element 450. In the present example, delivery element 450 is an optical multi-core fiber. Each radiation beam is coupled into a different physical channel of the delivery element, i.e. into a different core of the multicore fiber. In addition, each of the fractions split off from radiation beam 410 by beamsplitters 492 and 494 is coupled into the delivery element 450.

The delivery element is coupled to the input of a demultiplexer 460. As will be described in more detail hereafter, the demultiplexer simultaneously demultiplexes all of the radiation beams in each of the cores of the delivery element 450. By contrast, in the alignment sensor AS of FIG. 3, each radiation beam is demultiplexed by a separate demultiplexer. The demultiplexed radiation beams are then coupled into a number of output fibers, which in turn are coupled to respective inputs on one or more processing units. Specifically, the horizontal and vertical components of the first outgoing beam 442a and the second outgoing beam 442b are coupled to the inputs of a position detection unit 490. The horizontal and vertical components of the fractions split off the information carrying beam by beamsplitters 484, 485 are coupled to the inputs of an asymmetry measuring arrangement 480. Additionally, each of the fractions split off from radiation beam 410 by beamsplitters 492 and 494 is coupled into the asymmetry measuring arrangement 480. For additional background information, please see PCT Patent Application Publication No. WO2015/051970 titled "Polarization Independent Interferometer", which is incorporated herein by reference in its entirety.

Figure 5:
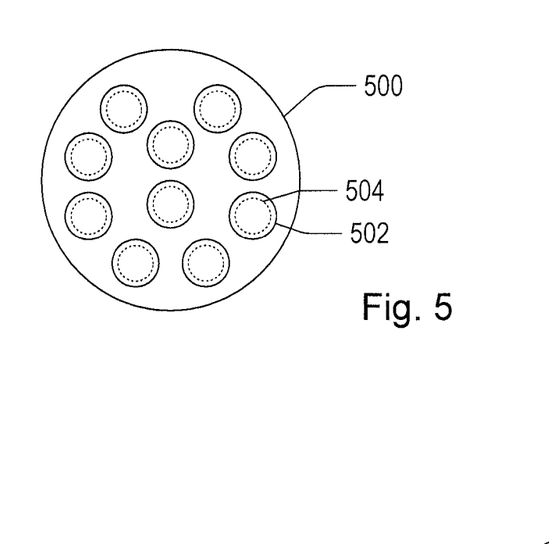
FIG. 5 is a cross-sectional diagram of a multi-core optical fiber suitable for use in the alignment sensor of FIG. 3.

FIG. 5 shows a cross-section of an exemplary delivery element in the form of an optical multicore fiber 500. The fiber comprises a plurality of individual fiber cores 502. Each fiber core carries a radiation beam 504 from one of the plurality of optical outputs from an alignment sensor. In the example, the multicore fiber comprises 10 cores, although this number could be higher or lower. Each of the radiation beams 504 comprises a plurality of optical channels, each optical channel having a different central wavelength.

Both of the exemplary alignment sensors described in the foregoing comprise at least one multiplexer and one or more demultiplexers. As described above, multiplexing enables the use of a plurality of wavelengths.

The alignment sensor described in FIG. 3 comprises a single intensity channel (referred to as "beam"), which comprises 4 multiplexed optical channels (referred to in FIG. 3 as "colors", and labelled G, R, N, F). As described with reference to FIG. 3, the single intensity channel is split into two components after passing through the self-referencing interferometer. Each component is demultiplexed separately, therefore involving the use of two demultiplexers in order to separate each of the optical channels of the two components.

The exemplary alignment sensor described in FIG. 4 comprises 10 intensity channels, each of which comprises 10 multiplexed optical channels. In order to demultiplex all of the intensity channels, using known arrangements, 10 demultiplexers would be used to demultiplex all of the intensity channels. Each demultiplexer, and the optical components therein, would have to be matched so as to perform identically. As previously described, meeting such requirements would be both time-consuming and expensive due to the large number of optical components involved.

Figure 6:
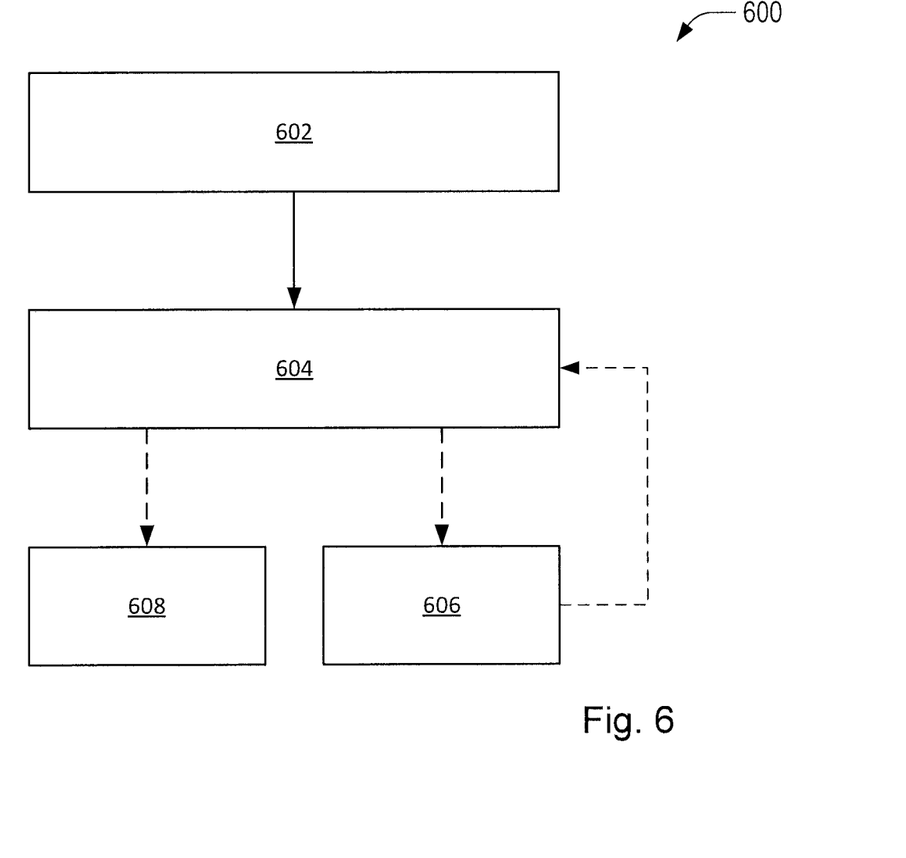
FIG. 6 is a diagram of a method according to an aspect of the present disclosure.

An exemplary method of demultiplexing an intensity channel comprising a plurality of optical channels will now be discussed with reference to FIG. 6. This method, as will be discussed in detail in the following, may be carried out simultaneously on a plurality of intensity channels, i.e. it may be carried out by the demultiplexer 460 described with reference to FIG. 4.

In a first step of the method 600, an input radiation beam is received 602. The input radiation beam comprises a first wavelength band which is dependent on the radiation source emitting the input radiation beam.

After being received, the input radiation is divided 604 into two radiation beam portions at a first stage of a demultiplexer.

The radiation beam portions are then transmitted 606 to a subsequent stage of the demultiplexer. If the subsequent stage is not the last stage, each radiation beam portion transmitted to the subsequent stage is divided into two further radiation beam portions. Each of the further radiation beam portions are then transmitted to a further subsequent stage.

Steps 604 and 606 are repeated until the radiation beam portions reach the final stage. At the final stage, the radiation beam portions are transmitted 608 to one or more outputs of the demultiplexer.

Figure 7:
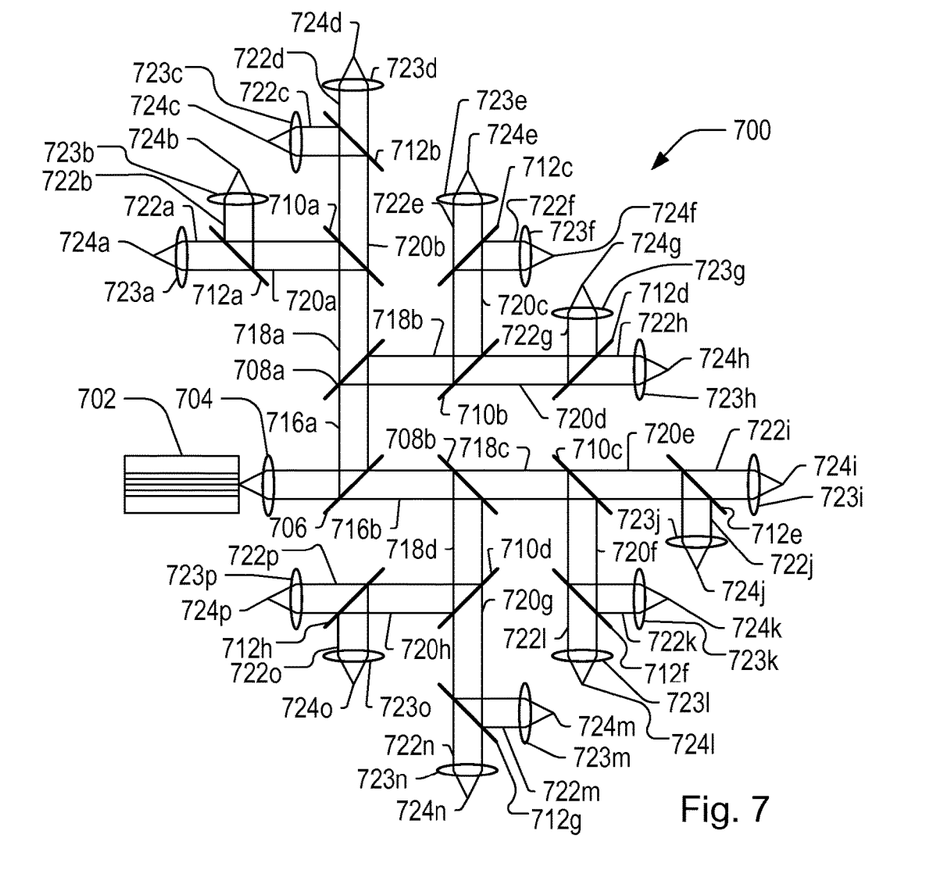
FIG. 7 is a schematic diagram of a demultiplexer implementing the method of FIG. 6.
Figure 8:
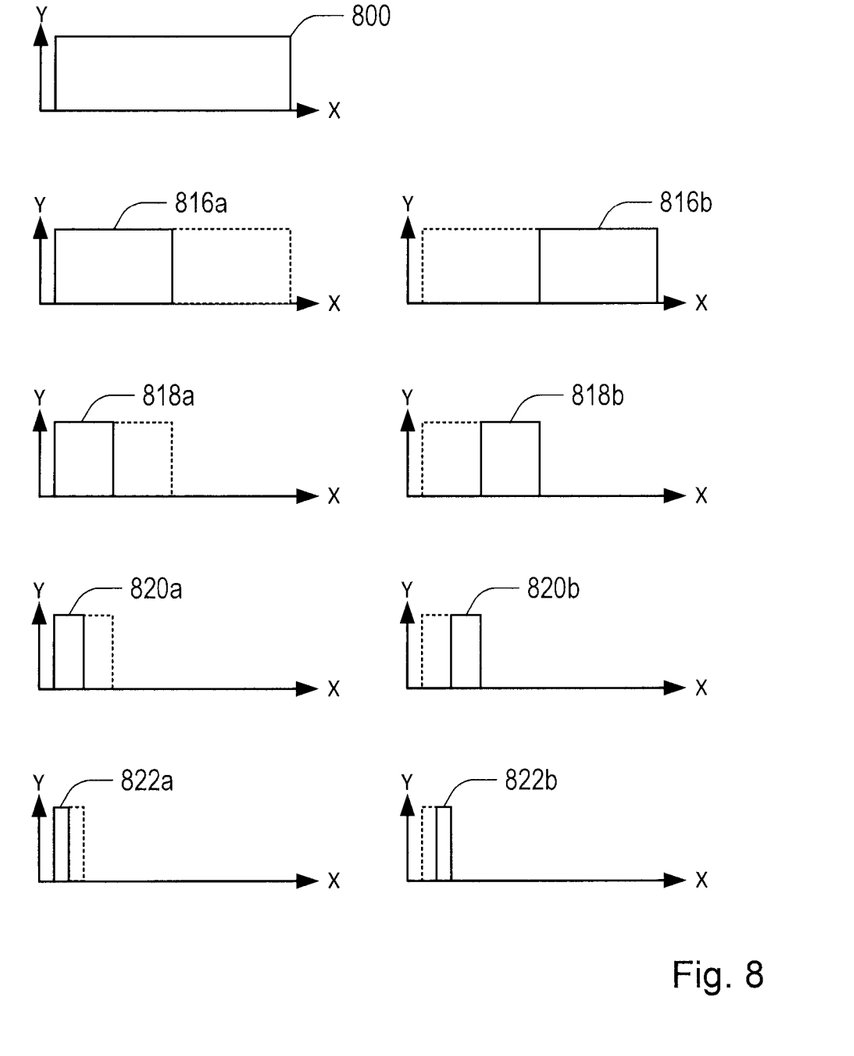
FIG. 8 depicts a representation of a wavelength band at as output by the various stages of the demultiplexer of FIG. 7.

Referring to FIGS. 7 and 8, an exemplary demultiplexer 700 is described. An optical fiber 702, such as the optical multicore fiber described in FIG. 5, is coupled to an input of the demultiplexer. Each core of the optical fiber 702 may thus have its own output location. In the embodiment of FIG. 7, the input of the demultiplexer is a positive lens 704.

It should be noted that, in the following, reference will be made to only one radiation beam, even though optical fiber 702 guides a plurality of radiation beams. It will be understood that the demultiplexer is functionally identical for all of the radiation beams, and that only one radiation beam need be described in detail.

Furthermore, it should be noted that the arrangement of components in the exemplary demultiplexer described in the following is two-dimensional for exemplary purposes only. In reality, the components may be arranged in three dimensions, for example to decrease the amount of space occupied by the demultiplexer. Additionally, the angle of incidence (AOI) of the radiation beams on the individual demultiplexing components is 45 degrees in the following example for exemplary purposes only. In reality, it is desirable to keep the AOI as close to 0 degrees as possible to avoid distortion of the beam fronts. In one embodiment, the AOI is 7 degrees, as this has been found to provide an acceptable amount of distortion of the beam fronts.

The demultiplexer comprises a plurality of stages, each with one or more demultiplexing components, that are arranged in series, as will now be described in detail. Each stage comprises twice the number of demultiplexing components as the stage immediately preceding it. The number of stages in a given demultiplexer is dependent on the number of optical channels that are to be demultiplexed. The maximum number of optical channels that can be demultiplexed by the demultiplexer 600 in relation to the number of stages is given by the relation $N_{DEMUX}=2^k$, where k is the number of stages in the demultiplexer. In the present example, the maximum number of optical channels that can be demultiplexed is $N_{DEMUX}=2^4=16$.

The first stage of the demultiplexer comprises a first demultiplexing component 706. The first demultiplexing component is operable to divide an input radiation beam into a first radiation beam portion 716a and a second radiation beam portion 716b. In the present example, the first demultiplexing component is operable to divide the input radiation beam such that the spectrum 816a of the first radiation beam portion comprises the first half of the spectrum of the input radiation beam, and the spectrum 816b of the second radiation beam portion comprises the second half of the spectrum of the input radiation beam. It is of course to be appreciated that the spectrum of the input radiation beam could be divided in any suitable fashion, e.g. such that the spectrum of the input radiation beam is divided unequally between the radiation beam portions. For example, embodiments may be envisaged where the spectrum of the first radiation beam portion is ¼ or ⅓ of the spectrum of the input radiation beam, and the spectrum of the second radiation beam portion is ¾ or ⅔ of the spectrum of the input radiation beam. These fractions are exemplary only, and in principle the spectrum of the input radiation beam could be divided in any suitable or desirable fashion.

The second stage of the demultiplexer 700 comprises two demultiplexing components 708a, 708b. Both of these demultiplexing components 708a, 708b are functionally identical to the first demultiplexing component 706. Demultiplexing component 708a takes as an input the first radiation beam portion 716a, and divides the input into two identical radiation beam portions 718a, 718b in a manner similar to the first demultiplxeing component 706. Radiation beam portion 718a has a spectrum 818a that comprises the first half of the input spectrum, i.e. the spectrum 816a of the first radiation beam portion 716a. Similarly, radiation beam portion 718b has a spectrum 818b that comprises the second half of the spectrum 816b of the second radiation beam portion 716b.

In a similar fashion, demultiplexing component 708b takes as an input the first radiation beam portion 716b, and divides the input into two identical radiation beam portions 718c, 718d.

The third stage of the demultiplexer 700 functions in a manner substantially identical to the first and second stages. In the present embodiment, the third stage comprises four demultiplexing components 710a, 710b, 710c, 710d, each of which are functionally identical to the demultiplexing components of the first and second stages. As an example, the operation of demultiplexing component 710a will now be described. Demultiplexing component 710a takes as an input beam radiation beam portion 718a, and divides it into two radiation beam portions 720a, 720b. Radiation beam portion 720a has a spectrum 820a that comprises the first half of the input spectrum, i.e. the spectrum 818a of radiation beam portion 718a. Similarly, radiation beam portion 720b has a spectrum 820b that comprises the second half of the spectrum 818a of radiation beam portion 718a.

The remaining demultiplexing components function in an analogous manner: demultiplexing component 710b divides radiation beam portion 718b into radiation beam portions 720c and 720d; demultiplexing component 710c divides radiation beam portion 718c into radiation beam portions 720e and 720f; and demultiplexing component 710d divides radiation beam portion 718d into radiation beam portions 720g and 720h.

The fourth stage of the demultiplexer 700 functions in a manner substantially identical to each of the first, second and third stages. In the present embodiment, the fourth stage of the demultiplexer comprises eight demultiplexing components 712a, 712b, 712c, 712d, 712e, 712f, 712g, 712h, each of which functions in a manner functionally identical to the demultiplexing components of the first, second and third stages. As an example, demultiplexing component 712a takes as an input beam radiation beam portion 720a, and divides it into two radiation beam portions 722a, 722b. Radiation beam portion 722a has a spectrum 822a that comprises the first half of the input spectrum, i.e. the spectrum 820a of radiation beam portion 720a. Similarly, radiation beam portion 722b has a spectrum 822b that comprises the second half of the spectrum 820a of radiation beam portion 720b.

The remaining demultiplexing components function in an analogous manner: demultiplexing component 712b divides radiation beam portion 720b into radiation beam portions 722c and 722d; demultiplexing component 712c divides radiation beam portion 720c into radiation beam portions 722e and 722f; demultiplexing component 712d divides radiation beam portion 720d into radiation beam portions 722g and 722h; demultiplexing component 712e divides radiation beam portion 720e into radiation beam portions 722i and 722j; demultiplexing component 712f divides radiation beam portion 720f into radiation beam portions 722k and 722l; demultiplexing component 712g divides radiation beam portion 720g into radiation beam portions 722m and 722n; and demultiplexing component 712h divides radiation beam portion 720h into radiation beam portions 722o and 722p.

Each of the plurality of radiation beam portions 722a-p of the fourth stage of the demultiplexer 700 then propagate to one of an identical plurality of demultiplexer outputs 724a-p, in the embodiment of FIG. 7 via respective lenses 723a-p. The lens 704 along with any one of the lenses 723a-p and the demultiplexing components along an optical path between the lens 704 and the one of lenses 723a-p together form a projection system. For instance, lenses 704, 723n and demultiplexing components 706, 708b, 710d, 712g together form a projection system configured to project an image from the object formed by the output locations of the cores of the optical fiber 702. Such projection systems can therefore maintain separation of the beams in the cores. In the present example, each of the demultiplexer outputs comprises a connector plate. This enables each of the radiation beam portions to be coupled directly into a respective connecting element, e.g. an optical fiber, which can be used to guide the radiation into e.g. the position detection arrangement 490 or the asymmetry measuring arrangement 480 described in FIG. 4. It should be noted, of course, that the demultiplexer outputs 724a-p could equally well comprise different connectors suitable for connecting to other types of connecting elements. For example, the demultiplexer outputs may comprise relay optics to compensate for divergence of the fiber 702.

It will of course be appreciated that the demultiplexer could be implemented in a number of specific ways. For example, in one exemplary embodiment, the demultiplexer may be implemented using "classical" optical components, in which the beams propagate through atmospheric gas (e.g., air). In another embodiment, the demultiplexer may be formed on a substrate using integrated optical components. Other implementations may also be envisaged.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that an embodiment of the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that an embodiment of the invention may be practiced otherwise than as described. For example, an embodiment of the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. An alignment sensor system comprising:
   an optical component configured to output a plurality of separate radiation beams, each radiation beam having an essentially same wavelength band; and
   an apparatus configured to receive the plurality of separate radiation beams from the optical component and demultiplex each of the separate radiation beams, the demultiplexing apparatus comprising:
   a plurality of stages arranged in series, the plurality of stages comprising a first stage and one or more subsequent stages; and
   a plurality of demultiplexing components, each demultiplexing component operable to divide input radiation into two radiation portions, wherein:
   the first stage comprises a first demultiplexing component arranged to receive, as input radiation, the plurality of separate radiation beams together, and
   the plurality of demultiplexing components are arranged such that each successive stage comprises twice the number of demultiplexing components as a preceding stage, each demultiplexing component of each stage after the first stage receiving as an input one of the radiation portions output from a demultiplexing component of the preceding stage.

2. The alignment sensor system according to claim 1, wherein each demultiplexing component comprises a dichroic filter.

3. The alignment sensor system according to claim 1, wherein the wavelength band comprises $2^k$ channels, the demultiplexing apparatus comprises k stages, and the demultiplexing apparatus is arranged such that each radiation portion from the last stage comprises a single channel.

4. The alignment sensor system according to claim 1, comprising a plurality of optical outputs, wherein each optical output is operable to output a specific radiation portion from the last stage of the demultiplexing apparatus.

5. The alignment sensor system according to claim 1, wherein the demultiplexing apparatus comprises a projection apparatus configured to project an image from an object upstream in an optical path with respect to the demultiplexing apparatus onto an image downstream in the optical path with respect of at least one of the demultiplexing components.

6. A lithographic apparatus comprising the alignment sensor system of claim 1.

7. A method of providing a position measurement, the method comprising:
   receiving, at a first stage comprising a first demultiplexing component, as input radiation a plurality of separate radiation beams together, each radiation beam having an essentially same wavelength band;
   using the first demultiplexing component to divide the input radiation into two radiation portions;
   receiving, at one or more successive stages, as input radiation radiation portions from a preceding stage, each of the one or more successive stages arranged such that each successive stage comprises twice the number of demultiplexing components as a preceding stage; and
   using each of the demultiplexing components to divide each radiation portion output by the preceding stage into two further radiation portions.

8. The method according to claim 7, wherein an object upstream with respect to the first demultiplexing optical component from which the input radiation is emitted is projected onto an image downstream with respect to at least one of the demultiplexing components.

9. The method according to claim 7, wherein the wavelength band comprises a plurality of optical channels, and further comprising:
   using each demultiplexing component in the last stage to divide the input radiation into a plurality of output radiation portions, wherein the central wavelength of each of the output radiation portions corresponds to the central wavelength of one of the channels of the plurality of optical channels.

10. The method according to claim 9, wherein the wavelength band comprises $2^k$ channels, the method involves k stages, and each of the output radiation portions comprises a single channel.

11. The method according to claim 7, further comprising outputting a specific radiation portion from the last stage to a specific optical output of a plurality of optical outputs.

12. An apparatus operable to carry out the method of claim 7.

13. The method according to claim 7, comprising using a dichroic filter at each demultiplexing component to divide the respective input radiation or radiation portion.

14. The method according to claim 7, wherein the radiation of the plurality of separate radiation beams is from a supercontinuum source.

15. The alignment sensor system according to claim 1, connected to an illumination subsystem, the illumination subsystem comprising a radiation source.

16. The alignment sensor system according claim 15, wherein the radiation source comprises a supercontinuum source.

17. An alignment sensor system comprising:
   an optical component configured to output a plurality of separate radiation beams, each radiation beam having an essentially same wavelength band; and
   an apparatus configured to receive the plurality of separate radiation beams from the optical component and demultiplex each of the separate radiation beams, the demultiplexing apparatus comprising:
   a plurality of stages arranged in series, the plurality of stages comprising a first stage and one or more subsequent stages; and
   a plurality of demultiplexing components, each demultiplexing component operable to divide input radiation into two radiation portions, wherein:

the first stage comprises a first demultiplexing component arranged to receive, as input radiation, the plurality of separate radiation beams together, and the plurality of demultiplexing components are arranged such that each successive stage comprises twice the number of demultiplexing components as a preceding stage, each demultiplexing component of each stage after the first stage receiving as an input one of the radiation portions output from a demultiplexing component of the preceding stage, wherein:

the wavelength band comprises a plurality of optical channels, each optical channel having a unique central wavelength, and the central wavelength of each of the radiation portions from the last stage corresponds to the central wavelength of one of the channels of the plurality of channels.

18. The alignment sensor system according to claim 17, wherein the wavelength band comprises $2^k$ channels, the demultiplexing apparatus comprises k stages, and the demultiplexing apparatus is arranged such that each radiation portion from the last stage comprises a single channel.

19. The alignment sensor system according to claim 17, wherein each demultiplexing component comprises a dichroic filter.

20. The alignment sensor system according to claim 17, wherein the demultiplexing apparatus comprises a projection apparatus configured to project an image from an object upstream in an optical path with respect to the demultiplexing apparatus onto an image downstream in the optical path with respect of at least one of the demultiplexing components.

* * * * *